(12) United States Patent
Shidei

(10) Patent No.: US 7,444,569 B2
(45) Date of Patent: Oct. 28, 2008

(54) SEMICONDUCTOR INTEGRATED CIRCUIT HAVING TEST CIRCUITRY WITH REDUCED POWER CONSUMPTION

(75) Inventor: Tsunaaki Shidei, Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 510 days.

(21) Appl. No.: 11/074,735

(22) Filed: Mar. 9, 2005

(65) Prior Publication Data

US 2005/0229058 A1 Oct. 13, 2005

(30) Foreign Application Priority Data

Apr. 9, 2004 (JP) .............................. 2004-115617

(51) Int. Cl.
*G01R 31/28* (2006.01)
(52) U.S. Cl. ...................................... 714/729; 714/727
(58) Field of Classification Search ................ 714/726, 714/729, 727; 327/202; 326/93, 46
See application file for complete search history.

(56) References Cited

U.S. PATENT DOCUMENTS

| 5,881,067 | A | * | 3/1999 | Narayanan et al. | 714/726 |
| 6,114,892 | A | * | 9/2000 | Jin | 327/202 |
| 6,380,780 | B1 | * | 4/2002 | Aitken et al. | 327/202 |
| 6,456,113 | B2 | * | 9/2002 | Kanba | 326/93 |
| 6,794,898 | B2 | * | 9/2004 | Komaki | 326/46 |

FOREIGN PATENT DOCUMENTS

JP 2002-311092 * 10/2002

OTHER PUBLICATIONS

The special topic 2 of the 2002/03 edition of homepage PR Magazine issued by Mentor Graphic Japan Co., Ltd.: What's DFTJ. URL:http//www.mentor.co.jp/N-V/02-03/TOPIC2.html.

* cited by examiner

*Primary Examiner*—David Ton
(74) *Attorney, Agent, or Firm*—Rabin & Berdo, P.C.

(57) ABSTRACT

The present invention provides a semiconductor integrated circuits that can prevent causes arising a problem of the power consumption during the normal operation thereof. Solution: The present invention relates to a semiconductor integrated circuit having a plurality of memory device of the scan thereof having functions to output the status values during the scan test therein. At least, a part of the memory device of the scan includes a first signal-outputting unit outputting a signal during the normal operation therein and a second signal-outputting unit outputting a signal during the scan test operation therein, respectively. Where, it is preferable that the first signal-outputting unit has a larger driving capacity to signal lines therein than the second signal-outputting unit, and that a second signal-outputting unit fixes the output signal level during the normal operation thereof, and that the second signal-outputting unit outputs a status value delayed a predetermined period of the operation clock therein compared with the first signal-outputting unit during the scan test thereof, and so on.

6 Claims, 9 Drawing Sheets

SEMICONDUCTOR INTEGRATED CIRCUIT HAVING TEST CIRCUITRY WITH REDUCED POWER CONSUMPTION

BACKGROUND OF THE INVENTION

The present invention relates to a semiconductor integrated circuit designed for testability, and the object is to reduce the power consumption of the test components thereof especially during the normal operation.

Among conventional semiconductor circuits, one of the most common ways of inserting a test circuit is the scan test method (refer to the non-patent document 1). FIG. 2(A) is a view of a circuit diagram illustrating a logic circuit (a combinational logic circuit) not including a test function. Since the logic circuit thereof cannot easily detect a malfunction inside the circuit, a component is added thereto so that a test scan can be done, shown in FIG. 2(B). In other words, a multiplexer MPX0-MPX2 is inserted to a preceding stage of a flip-flop FF0-FF2 of a component of the combinational circuit so that a path P0-P2 being used exclusively for a test and being different from a normal path can be composed. Then, setting a value of the flip-flop and reading the value thereof can be done easily, and subsequently a defect of the combinational circuit comprising the flip-flop in the production line can be detected. At the same time, a part of the test-only path (a path P0, P1 shown in FIG. 2(B)) is branched from the primary path of the flip-flop and is inputted to a multiplexer at the input stage of the flip-flop at the subsequent stage.

Recently, since a difficulty of test in large scale logic circuit has been increasing exponentially, the test can not be done without the scan test function thereof. Subsequently, the above mentioned scan test function has to be introduced, even though many circuit overheads are introduced to the part other than the primary circuitry and causes increasing of the power consumption thereof.

[Non-patent document 1] The special topic 2 of the March 2002 edition of homepage PR Magazine issued by Mentor Graphic Japan Co., Ltd.: What's DFTJ. URL:http//www-.mentor.co.jp/N-V/02-03/TOPIC2.html.

While, in the case of a large scale integrated circuit (Ultra LSI), the request for low power consumption is very high. Consequently, even when a test scan function is introduced, the increase of power consumption should be minimized. However, with the scan-test introduced circuit configuration shown in FIG. 2(B), the reducing of power consumption thereof is not enough.

Since the test-only path P0-P2 shown in FIG. 2(B) is configured by branching the output path of the flip-flop FF0-FF2, the abovementioned path is driven during the normal operation not test operation even though the path is isolated by the selector at the subsequent stage and then operating power consumption exists.

Furthermore, by development of semiconductor manufacturing technology, finer pattern can be available to realize larger scale integrated circuit. At the same time, capacitance in wiring therein increases and delay time therein depends on the real layout thereof. Consequently, many delay circuits (for example, inverters) may be inserted to the test-only path between the flip-flops to adjust the timing to a logic circuit under a test. In the above case, the test-only path is driven even during the normal operation not test operation, causing the operating power consumption problem. Since the power consumption in the delay circuits (for example, inverters) is not small, the total power consumption is very large.

Most logic semiconductor integrated circuits are often fabricated with CMOS. The multi-stage delay circuit (for example, inverter) inserted to test-only path thereof is fabricated with CMOS, too. The recent CMOS technology arises some leak current, however, causing a problem of the non-operating power consumption of the test-only circuit during the normal operation not test operation.

Although the scan test is done once or several times during a certain period of the inspection for shipment, the normal operation is frequently conducted and then the power consumption during the normal operation is a big issue.

For the above-mentioned reason, a semiconductor integrated circuit that can prevent causes of the problem of the power consumption during normal operation thereof is being highly demanded In view of the above, it will be apparent to those skilled in the art from this disclosure that there exists a need for an improved relay device. This invention addresses this need in the art as well as other needs, which will become apparent to those skilled in the art from this disclosure

SUMMARY OF THE INVENTION

According to the present invention, to solve the above problem, a semiconductor integrated circuit having a plurality of scan memory of function to output a status value during the scan test; consists of a first signal output unit where a part of the above scan memory outputs a signal at the normal operation; and a second signal output unit where a part of the above scan memory outputs a signal at the scan test operation, independently.

THE EFFECT OF THE INVENTION

Since the semiconductor integrated circuit according to the present invention includes the first signal output unit outputting the signal during the normal operation and the second signal output unit outputting the signal during the scan test operation independently, several actions can be done, for example, halting the second output unit only. Consequently, it can be prevented that the scan test circuit configuration causes the power consumption problem during the normal operation.

DETAILED DESCRIPTION OF THE PREFERRED EMBODIMENTS

Selected embodiments of the present invention will now be explained with reference to the drawings. It will be apparent to those skilled in the art from this disclosure that the following descriptions of the embodiments of the present invention are provided for illustration only and not for the purpose of limiting the invention as defined by the appended claims and their equivalents.

First Embodiment

The semiconductor integrated circuit designed for testability according to the first embodiment of the present invention will be explained, as below.

Figure 1:
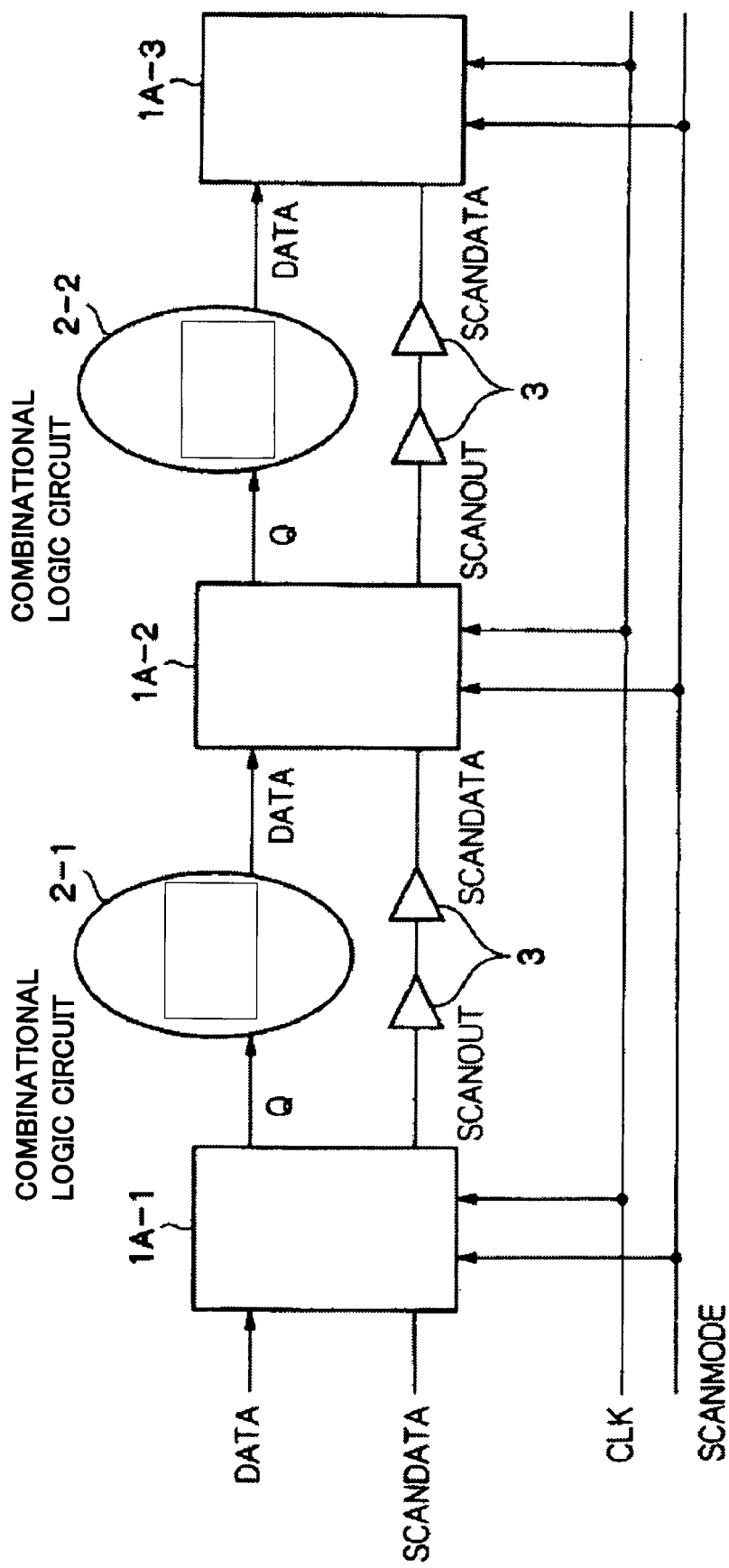
FIG. 1 is a view of a block diagram illustrating an example of semiconductor integrated circuits in accordance with the first embodiment.

The semiconductor integrated circuit according to the first embodiment introduces a first or second scan flip-flop 1A, 1B having input and output terminals shown as the symbols in FIG. 3(A) or (B) into the appropriate position therein. FIG. 1 illustrates an example thereof.

Figure 2:
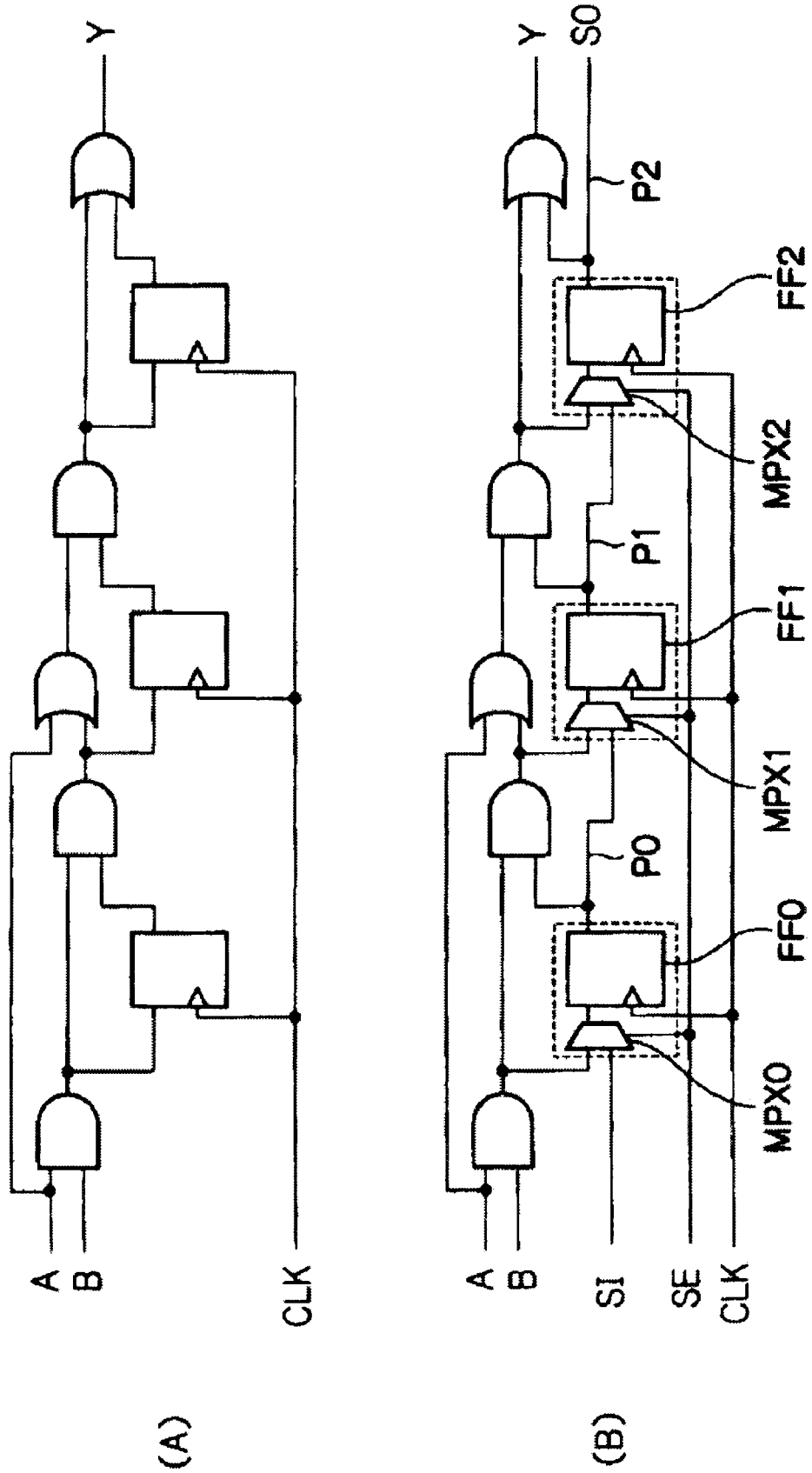
FIG. 2 is a view of a explanatory block diagram illustrating a conventional semiconductor integrated circuit having a scan test function.

Where, the scan flip-flop is a component part including a flip-flop belonging to the primary combinational circuit and circuit elements necessary to conduct the scan test, and the above combination is corresponding to the combination of the multiplexer and the flip-flop in FIG. 2 concerned with a conventional technology.

The first and second scan flip-flop 1A, 1B shown in FIG. 3(A), (B) is corresponding to the case when the flip-flop is D flip-flop. The first flip-flop shown in FIG. 3(A) includes an input terminal SCANMODE of a mode signal representing the scan test mode or the normal operation mode, an input terminal SCANDATA of the data inputted during the scantest, and an output terminal SACNOUT of the data outputted during the scan test, in addition to a data input terminal DATA necessary as a D flip-flop, a clock input terminal CLK, and a non-inverted output terminal Q. The different point of the second scan flip-flop shown 1B in FIG. 3(B) is having a reverse output terminal QN in addition to the input and output terminals of the first flip-flop. Each signal or data of the input terminals or the output terminals is appropriately referred to the name of the input or output terminals, in the explanation as below.

Figure 3:
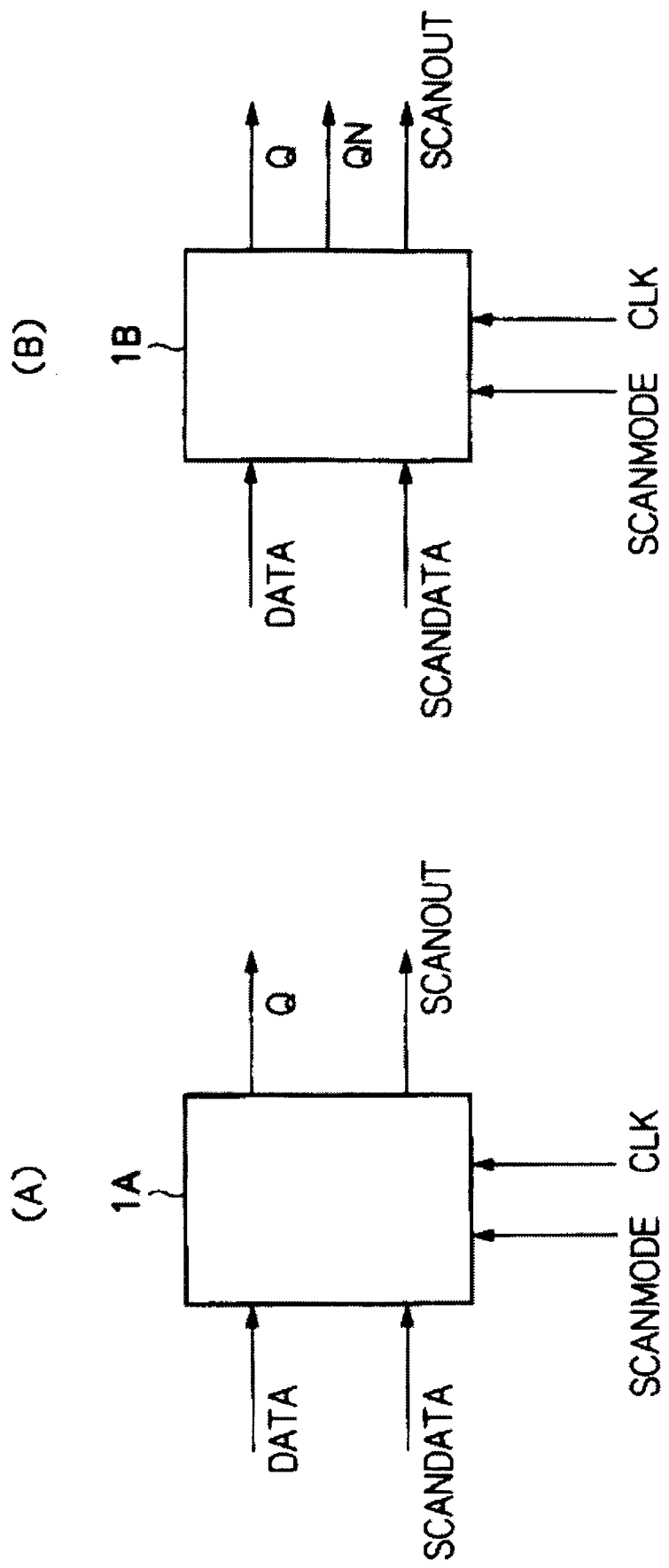
FIG. 3 is a view of an explanatory diagram illustrating input and output terminals of a scan flip-flop in accordance with the first embodiment.

The non-reverse output terminal Q of the first scan flip-flop 1A can be replaced by a flip-flop having a reverse output terminal QN (the third scan flip-flop), not shown in FIG. 3. Furthermore, the scan flip-flop can include a reset input terminal and a set input terminal.

The scan flip-flop according to the first embodiment of the invention has a point that the output terminal for the normal operation, in other words non-reverse output terminal Q or the reverse output terminal QN is independently separated with the output terminal SCANOUT for the scan test operation.

Furthermore, according to the first embodiment of the invention, the no-reverse output terminal Q of a certain stage scan flip-flop 1A-1, 1A-2 is connected to the data input terminal DATA of the next stage scan flip-flop 1A-2, 1A-3, through the combinational circuit 2-1, 2-2, and the data output terminal for the scan test SCANOUT of the a certain-stage scan flip-flop 1A-1, 1A-2 is connected to the data input terminal SCANDATA of the next stage scan flip-flop 1A-2, 1A-3, through the buffer amplifier 3, as shown in FIG. 1. The first embodiment has a point that the data path during the normal operation and the data path during the scan test operation are isolated independently, as explained the above. The test-only path is inserted by buffer amplifier 3 having an appropriate number of stages (two stages in the case of FIG. 1), and the delay-time adjustment is made, from SCANOUT to SCANDATA of next-stage scan flip-flop.

Figure 4:
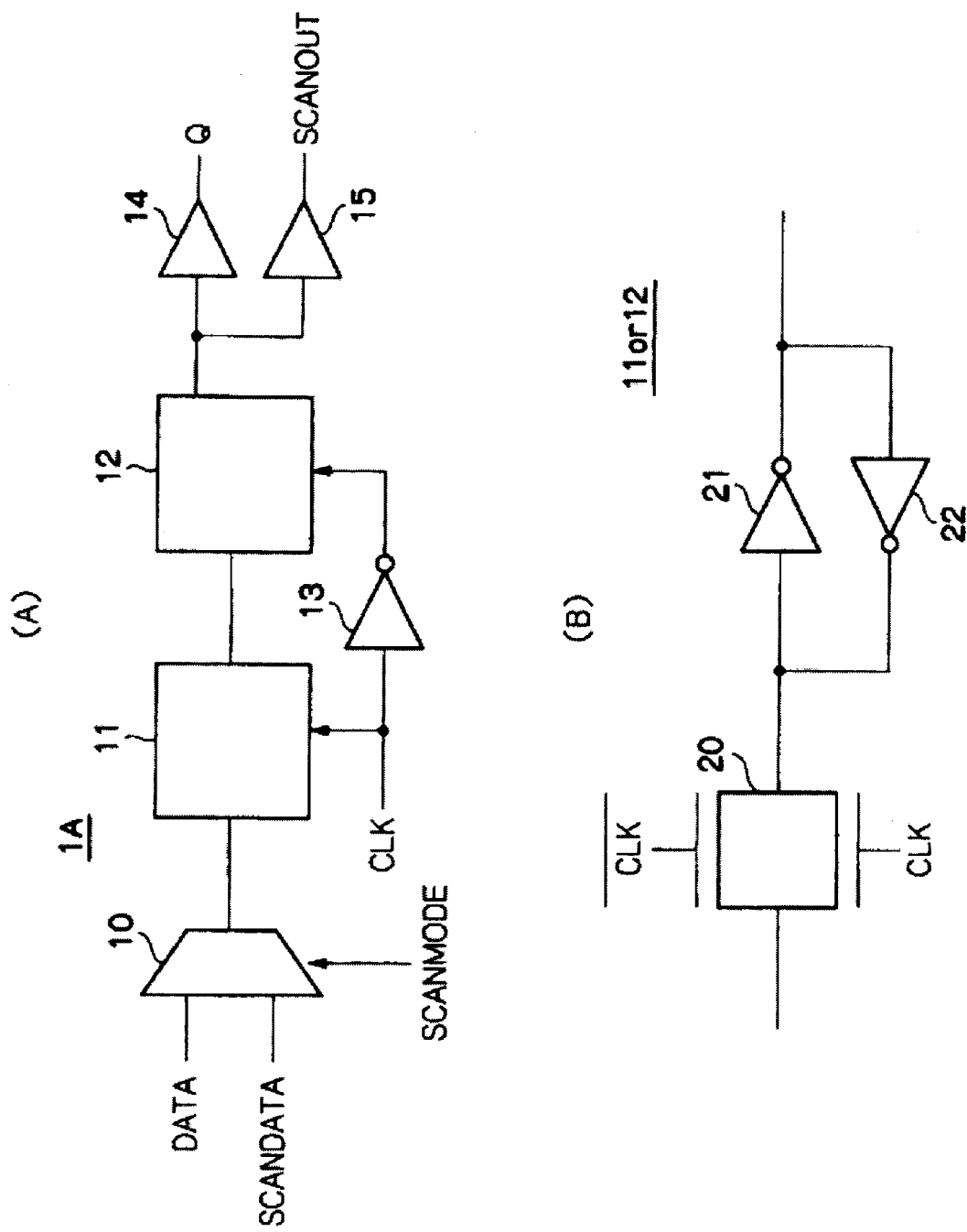
FIG. 4 is a view of a block diagram illustrating a configuration inside a scan flip-flop in accordance with the first embodiment.

In FIG. 4 is a view of a block diagram illustrating a specific configuration of the first scan flip-flop. As shown in FIG. 4(A) among others, the first scan flip-flop 1A consists of a multiplexer 10, a latch circuit 11, a latch circuit 12, a driver 14 (buffer amplifier), and driver 15 (buffer amplifier). The multiplexer 10 selects the data of the normal operation mode or the scan test operation mode according to the operation mode. The latch circuit 12 latches the output from the latch circuit 11, based on the reversed output of the operation clock outputted from the inverter 13. The driver 14 having the higher driving capability drive the connected line of the output terminal Q at a high speed, according to the output from the latch circuit 12. The deriver 15 having the lower driving capability drive the connected line of the output terminal SCANOUT at a lower speed, according to the latch circuit 12. The latch circuit 11 or 12 can have any specific configuration, and then the configuration including a transfer gate 20 and two inverters 21, and 22 connected in parallel to each other in the opposite direction, shown in FIG. 4(B), can be taken for instance.

Where, the latch circuit 11, 12 and the inverter 13 comprise a D flip-flop.

In FIG. 1, when the SACNMODE signal is 'true', each scan flip-flop 1A-1-1A-3 is respectively switched to the scantest mode, and the SACNDATA input signal to each scan flip-flop 1A-1-1A-3 is changed to be available, and the logic value of the SCANDATA signal is set to each scan flip-flop 1A-1-1A-3 at the input timing of the clock CLK, and at the same time the preceding status value of the scan flip-flop 1A-1-1A-3 is outputted to the SCANOUT signal, transferred to the next-stage scan flip-flop 1A-2-1A-3—, and the next-stage scan flip-flop 1A-1-1A-3—is fetched in at the next input timing of the clock CLK.

Where, the status value of the scan flip-flop 1A-1-1A-3—is outputted to the Q signal from the scan flip-flop 1A-1—1A-3 at the same timing as the SCANOUT signal (reversed status value of the scan flip-flop 1B is outputted to the QN). Subsequently, as in a conventional circuit, it is possible that the data is given to the combinational circuit part 2-1, 2-1 connected to each scan flip-flop 1A-1—1A-3 after the scan test mode is set to each scan flip-flop 1A-1—1A-3, and that each scan flip-flop 1A-1—1A-3 fetches in the output data from the data input terminal D at the input timing of the clock CLK by setting the SCANMODE to 'false'. Further, the data taken by each scan flip-flop 1A-1—1A-3 can be read out by setting the SCANMODE to 'true'.

While the normal operation mode is done, the SCANMODE signal is fixed to the logic value of 'false', different from the scantest mode. In other words, the SCANMODE signal or the SCANOUT signal is not available. In a conventional way, since the SCANMODE signal is not changed to be available by the SCANOUT signal, the situation is same to the embodiment of the invention. However, since the SCANOUT signal is isolated from the Q signal or the QN signal and forms the different path, the speed-sensitive data signal (the Q signal and the QN signal) is composed, putting a priority on the delay time therein, shown FIG. 4. On the contrary, since the SCANOUT signal may be too fast to make an fetching-in error at the next stage and to fail in test, the delay time can be long and then the driving capability can be minimized to reduce the power cthe extra consumption therein.

Generally, since the scan test is only done limited times and is not performed after handing in to customers, the reliability is more important than the operating speed. Furthermore, even if the delay time is long, there is no problem because the other path independently isolated from the normal operation path.

As explained before, according to the first embodiment of the present invention, the scan signal (the SCANOUT signal) can be outputted with the minimum power consumption during the scan test operation, maintaining the necessary operation speed in the normal operation path, by isolation the valid output from the scan flip-flop during the normal operation from the valid output from the scan flip-flop during the scan test operation.

At the same time, since the scan path is isolated and the driving unit thereof having the low capacity is adapted, the power consumption of the scan path during the normal operation can be reduced and realize the low power operation.

Furthermore, the clock skew between the flip-flops can easily cause a problem during the scan test operation by the recent finer patterning technology. In the conventional circuit, many delay compensation circuits should be inserted to the path of the scan path test. On the contrary, the number of the delay compensation circuit used for compensation of the skew therein can be reduced, leading to the less power consumption than the conventional circuit, because the path of the scan path test is isolated from the path of the normal operation and also is driven by the low operation speed driver, according to the first embodiment of the invention.

Second Embodiment

Figure 5:
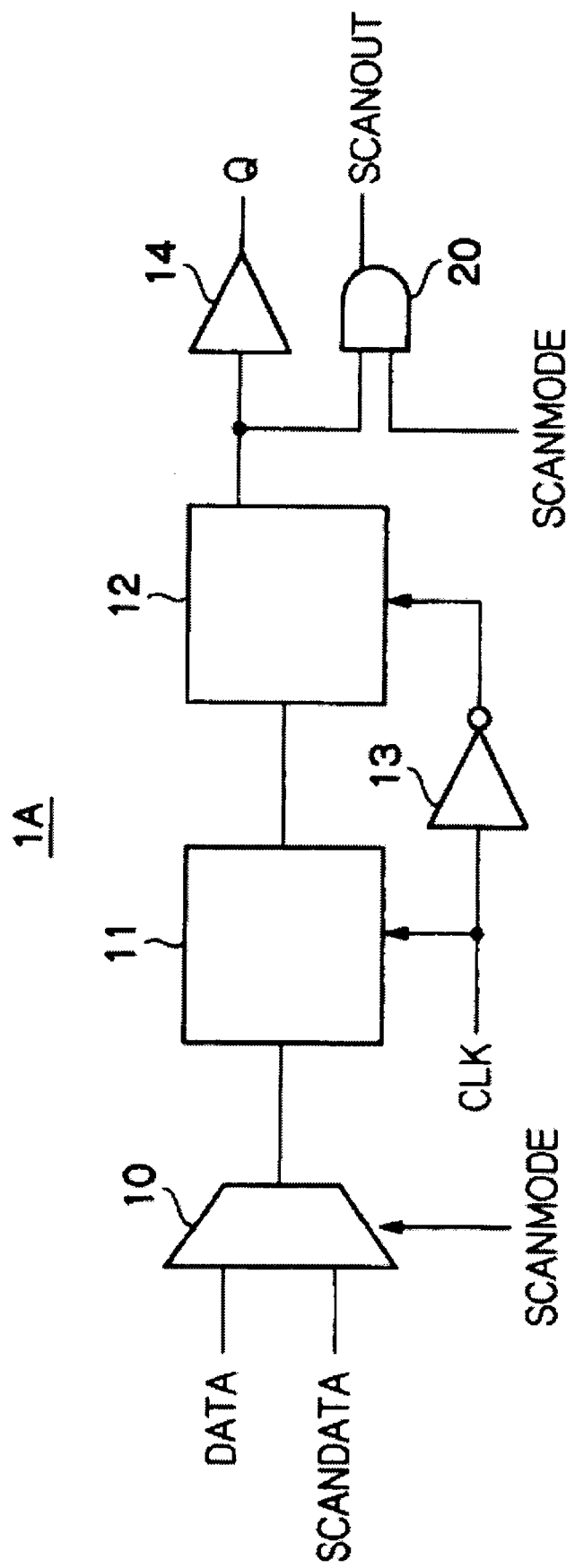
FIG. 5 is a view of a block diagram illustrating a configuration inside a scan flip-flop in accordance with the second embodiment.

FIG. 5 is a view of the block diagram illustrating a configuration inside a scan flip-flop of a semiconductor integrated circuit according to the second embodiment of the present invention. The same signs are labeled with the same or the corresponding part according to the first embodiment of the invention in FIG. 4.

The semiconductor integrated circuit according to the second embodiment has the different configuration inside the scan flip-flop 1A, compared with the first embodiment. In the case of the second embodiment, the logic gate (FIG. 5: AND logic gate) is included, instead of the driver 15 (buffer amplifier) driving the output terminal SCANOUT. The logic gate 30 thereof is configured so that the SCANOUT signal can be controlled by the SCANMODE signal.

When the SCANMODE signal is "false" (during the normal mode), the logic gate 30 performs logic operation between the SCANMODE signal and the output signal from the latch 12 and outputs the result thereof so that the SCANOUT signal can be fixed to "true" or "false". When the SCAMODE signal is "true" (during the scan test mode), the logic gate 30 outputs the same value (or the inverted value) of the Q output signal. For example, when the "zero" level is used as the "false" logic value, the AND gate therein is applied to the logic gate 30, as shown in FIG. 5.

As shown FIG. 1, the SCANOUT signal from the flip-flop at the certain stage (where, 1A-1 is taken) is inputted to the flip-flop 1A-2 as the SACNDATA signal. When the SACNMODE signal is "false", however, the SCANOUT signal is not taken by the next-stage flip-flop 1A-2, because the SACNDATA signal is not available. Consequently, when the SACNMODE signal is "false", the logic value of the SCANOUT signal from the scan flip-flop 1A-1 has not to be the same to the Q output signal. In other words, since the SCANMODE signal is "false" constantly during the normal mode thereof, there is no need to change the SCANOUT signal. If the SCANOUT signal were changed, the power consumption therein would be extra (wasteful).

As explained before, according to the second embodiment, since the path of the SCANOUT signal is isolated from the path of the Q output signal and also the value of the SCANOUT signal is fixed, the operation of the scan path circuit can be completely shuttered and then the dynamic current of the test circuit is eliminated. Subsequently, the increase of the power consumption by adding the scan test circuit thereto can be cancelled.

As is generally known, the CMOS architecture applied to semiconductor circuits has the characteristic that the power consumption increases when the logic value thereof is changed, and then the power consumption therein can be mostly eliminated by fixing the logic value thereof if the buffer amplifiers or the inverters inserted in the scan path has the CMOS architecture.

Figure 6:
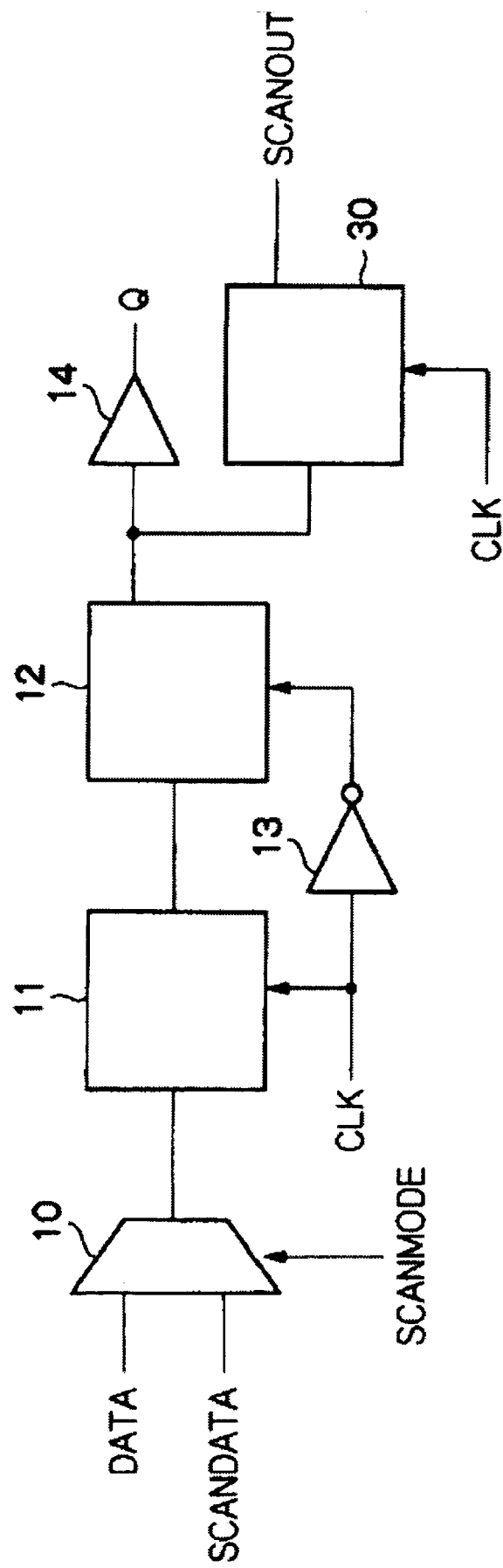
FIG. 6 is a view of a block diagram illustrating a configuration inside a scan flip-flop in accordance with the third embodiment.

Since some margin to patterning power lines can be acquired by reducing the circuit power consumption, optimizing of the power line width can be made and then the chip size thereof is reduced. Consequently, the capacitance residing the wiring pattern can be reduced and the further reduction of power consumption can be expected Third Embodiment FIG. 6 is a view of a block diagram illustrating an configuration inside a scan flip-flop in a semiconductor integrated circuit according to the third embodiment of the present and the same or the corresponding component as the ones in FIG. 4 according to the first embodiment is labeled with the same signs.

The semiconductor integrated circuit according to the third embodiment of the invention has the different configuration inside the scan flip-flop 1A, compared with the first embodiment of the invention, and the driver (buffer amplifier) driving the output terminal SCANOUT can be replaced by the latch circuit 30 according to the third embodiment. The latch circuit 30 is composed to delay the output from the latch circuit 12 (in other words, the Q output signal) by a half period of the clock CLK to be the SCANOUT signal. Since any given configuration can be applied to the configuration inside the latch circuit 30, the aforementioned configuration shown in FIG. 4(B) is applicable.

Figure 7:
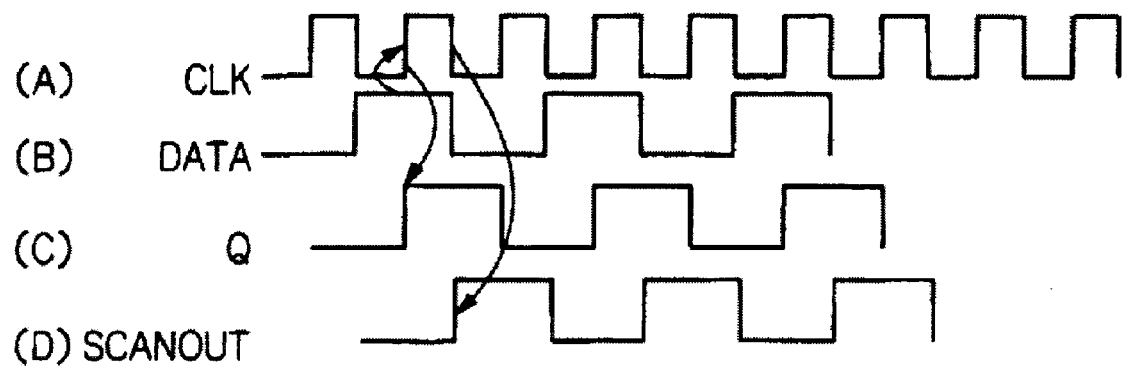
FIG. 7 is a view of a timing chart illustrating each unit of FIG. 6.
Figure 8:
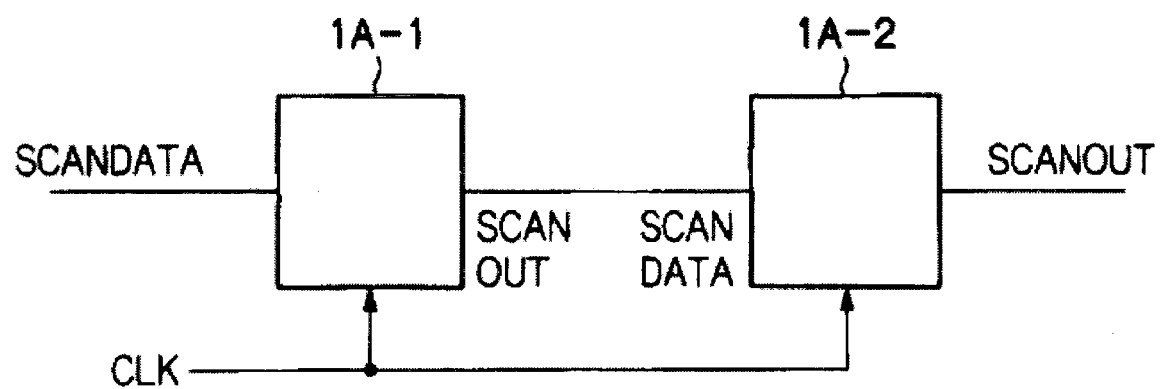
FIG. 8 is a view of a block diagram illustrating an example of daisy-chained connections between scan flip-flops in accordance with the embodiment in FIG. 3.

FIG. 7 is a view of a timing chart of the components in FIG. 4. For example, the input data DATA (SCANDATA is acceptable, too) of the scan flip-flop according to the third embodiment is fetched in at the rising edge of the clock CLK and becomes the Q output signal. At the same time, by the processing of the latch circuit 30 newly laid out, the SCANDATA signal is delayed by the half phase of the clock CLK.

Hereinafter, a daisy-chained connection of the scan flip-flop 1A-1 and 1A-2 without buffer amplifiers or inverters inserted (refer to FIG. 1) during the scan test mode will be explained.

Figure 9:
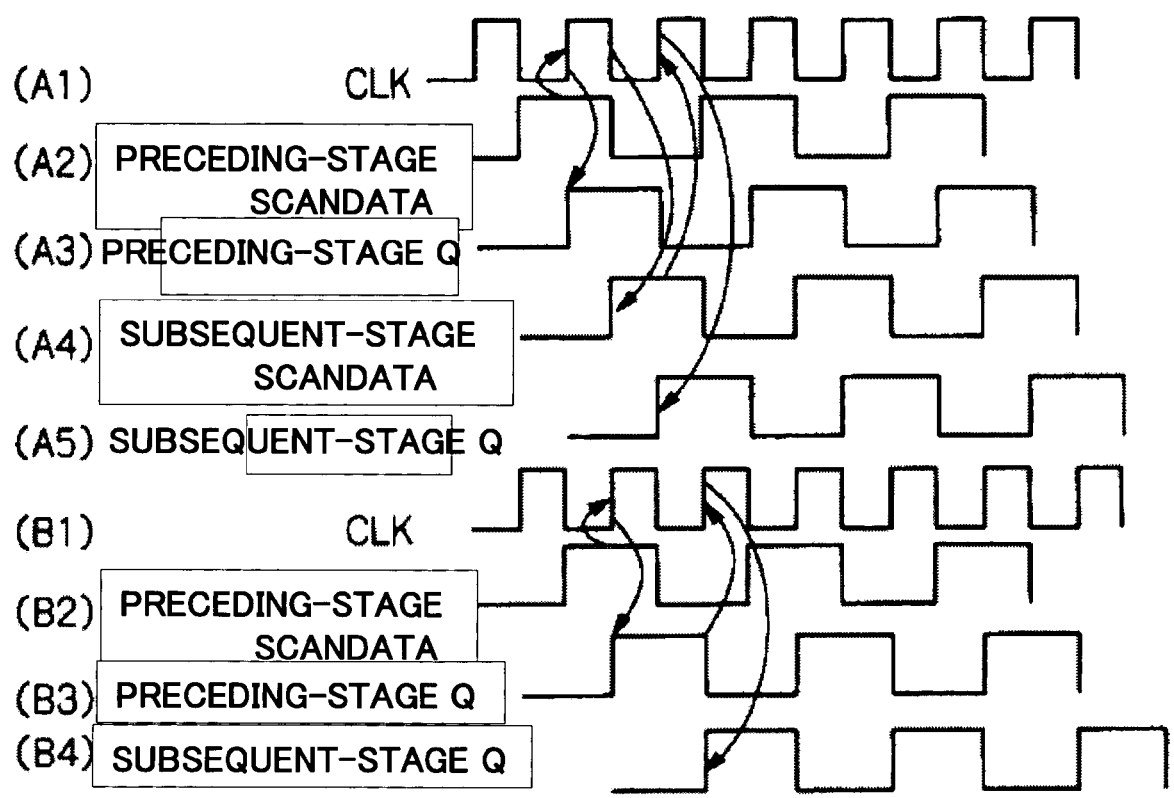
FIG. 9 is a view of a timing chart illustrating each unit of FIG. 8.

When a circuit not including the latch circuit 30 is applied to the scan flip-flop 1A-1 and 1A-2, not in accordance with the third embodiment, the Q signal from the preceding-stage scan flip-flop 1A-2 and the SCANOUT signal have the same timing as each other (refer to FIG. 9(B3)) and then the Q output signal from the preceding-stage scan flip-flop 1A-1 and the Q output signal from the subsequent-stage scan flip-flop 1A-2 (refer to FIG. 9(B4)) have the timing difference of about one period of the clock CLK. The difference thereof means that the set-up time is about one period of the clock CLK and the hold-time is about nothing at the subsequent-stage 1A-2. As described before, when the set-up time and the hold time are not well-balanced each other, the malfunction thereof may occur by the dispersion of the clock or the scan path arising after the lay out therein. Subsequently, many delay compensation circuits should be inserted between the scan flip-flop 1A-1 and 1A-2 to avoid the malfunction thereof, causing a problem of the power consumption at the delay compensation circuits therein.

On the contrary, when the scan flip-flop 1A-1 and 1A-2 include the latch circuit 30 according to the third embodiment, the SCANOUT signal from the scan flip-flop 1A-1 shown FIG. 9(A4) is delayed by a half phase of the clock CLK compared with the Q output signal, and the SCANOUT signal is fetched in the subsequent-stage scan flip-flop 1A-2 and becomes the Q output signal (refer to FIG. 9(A5)). Considering the phase relationship between the SCANOUT signal inputted to the scan flip-flop 1A-2 and the clock CLK, the set-up time of the scan flip-flop 1A-2 is about a half period of the clock CLK and the hold time thereof is about a half period of the clock CLK, too. As explained above, when the set-up time and the hold time thereof are well-balanced each other, countermeasures to the layout or countermeasures such as adding delay compensation circuits are not necessary therein.

As explained before, according to the third embodiment, since the SCANOUT signal and the Q output signal are isolated from each other and at the same time the SCANOUT signal outputs, delayed by a half phase of the clock thereof from the Q output signal when the SCANMODE signal is "true", the number of the inverters or the buffer amplifiers inserted the scan path to compensate the clock skew therein can be eliminated or reduced. Since the items to be considered for the layout thereof is reduced by eliminating the inverters or the buffer amplifiers therein, the flexibility of the layout is increased and the downsizing of the chip-size can be expected, and then the low power consumption thereof can be expected, too.

Recently, the finer patterning technology of LSI has been making a grate progress and many delay-compensation circuits for adjust the timing therein has become indispensable, and then the areas of the one-stage latch circuit added to the flip-flop can be neglected. Furthermore, although the leak current of the non-operating circuits has become unable to be neglected, since the circuits inserted to the scan path thereof to compensate the delay time can be eliminated or reduced, the reduction of the power consumption arising from the leak current of the non-operation circuits can be achieved.

Forth Embodiment

Figure 10:
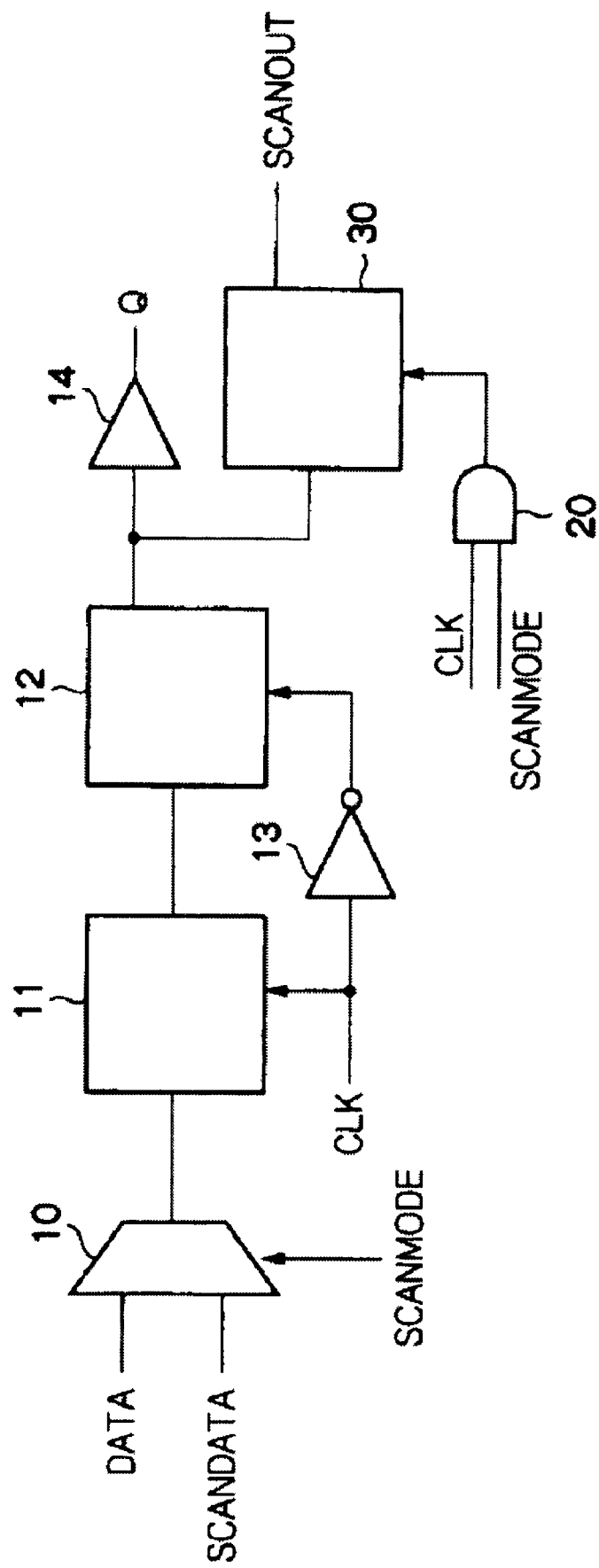
FIG. 10 is a view of a block diagram illustrating a configuration inside a scan flip-flop in accordance with the forth embodiment.

FIG. 10 is a view of a block diagram illustrating the configuration inside a scan flip-flop of a semiconductor integrated circuit in accordance with the forth embodiment of the invention. The same or corresponding parts as the ones in FIG. 4, FIG. 5, or FIG. 6 according to the aforementioned embodiments are labeled with the same signs.

The aforementioned technical idea according to the second embodiment that each logic level of the paths of the scan test is fixed and the aforementioned technical idea according to the third embodiment that the SCANOUT signal from the scan flip-flop is delayed by a half phase of the Q signal during the scan test are both adopted to the scan flip-flop according to the forth embodiment of the invention.

The SCANMODE signal and the clock CLK is inputted to the logic gate (AND gate) 20. And the logic gate 20 is an accomplishment of the aforementioned second embodiment and the output from the logic gate 20 is inputted to the latch circuit 30 as the clock signal. In other words, the clock inputting thereto is stopped so that each logic level of the paths of the scan test can be fixed.

In addition, it is possible that the logic gate 20 is placed in the output side of the latch circuit 30 to which the output from the latch circuit 30 and the SCANMODE signal are inputted so that each logic level of the paths of the scan test can be fixed, not same as shown in FIG. 10.

According to the forth embodiment, since the effect of the second embodiment described before and the effect of the third embodiment described before can work together, for example, the effect on the power consumption thereof becomes much larger by the mutual effect therein.

Other Embodiments

According to each embodiment described above, the D-flip-flop is applied to the flip-flop thereof, however, other types of flip-flops (RS flip-flop, JK flip-flop, T flip-flop) can be applied to the flip-flop, too. Further, various types of flip-flop can be applied together for the scan test mode. In addition, devices saving other status such as memory devices or ROMS can be applied to the path entrance or path exit of the scan test mode thereof.

Furthermore, according to the aforementioned embodiments, although all scan flip-flop have the output terminals of the Q signal and the SACNOUT signal respectively, only a part of the above scan flip-flop can have the output terminals of the Q signal and the SACNOUT signal respectively.

What is claimed is:

1. A semiconductor integrated circuit having a test mode and a normal operation mode, comprising:
   a plurality of scan memory devices which output status values during a scan test operation in the test mode, each scan memory device including
      a first signal-outputting unit, that outputs a signal during the normal operation mode; and
      a latch circuit serving as a second signal-outputting unit that outputs a signal on a scan path during the scan test operation.

2. The semiconductor integrated circuit according to claim 1, wherein said first signal-outputting unit has a larger driving capacity to signal lines than said second signal-outputting unit.

3. The semiconductor integrated circuit according to claim 2, wherein said second signal-outputting unit outputs said status values delayed by a predetermined period of an operation clock from a timing of outputting said status values by said first signal-outputting unit during said test mode operation.

4. The semiconductor integrated circuit according to claim 1, wherein said second signal-outputting unit fixes an output signal level during said normal operation mode.

5. The semiconductor integrated circuit according to claim 4, wherein said second signal-outputting unit outputs said status values delayed by a predetermined period of an operation clock from a timing of outputting said status values by said first signal-outputting unit during said test mode operation.

6. The semiconductor integrated circuit according to claim 1, wherein said second signal-outputting unit outputs said status values delayed by a predetermined period of an operation clock from a timing of outputting said status values by said first signal-outputting unit during said test mode operation.

* * * * *